United States Patent
Ho et al.

(10) Patent No.: US 7,130,221 B1
(45) Date of Patent: Oct. 31, 2006

(54) DUAL GATE MULTI-BIT SEMICONDUCTOR MEMORY

(75) Inventors: ChiaHua Ho, Kaohsiung (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/234,983

(22) Filed: Sep. 26, 2005

(51) Int. Cl.
*G11C 11/34* (2006.01)
(52) U.S. Cl. ............... 365/185.18; 365/185.14
(58) Field of Classification Search ........... 365/185.18, 365/185.14, 185.28, 185.29
See application file for complete search history.

(56) References Cited

U.S. PATENT DOCUMENTS

| | | | |
|---|---|---|---|
| 6,011,725 A | 1/2000 | Eitan | |
| 6,133,098 A * | 10/2000 | Ogura et al. | 438/267 |
| 6,320,786 B1 | 11/2001 | Chang | |
| 6,380,068 B1 | 4/2002 | Jeng | |
| 6,563,728 B1 * | 5/2003 | Kobayashi | 365/185.05 |
| 6,590,266 B1 | 7/2003 | Liu | |
| 6,643,170 B1 | 11/2003 | Huang | |
| 6,649,971 B1 | 11/2003 | Yeh | |
| 6,762,467 B1 | 7/2004 | Jong | |
| 6,768,165 B1 | 7/2004 | Eitan | |
| 6,822,900 B1 * | 11/2004 | Kamei | 365/185.11 |
| 6,878,991 B1 * | 4/2005 | Forbes | 257/328 |
| 6,888,755 B1 | 5/2005 | Harari | |
| 2004/0042270 A1 | 3/2004 | Huang | |

* cited by examiner

*Primary Examiner*—Anh Phung
(74) *Attorney, Agent, or Firm*—Akin Gump Strauss Hauer & Feld, LLP

(57) ABSTRACT

A method for altering and reading the contents of a memory cell includes the steps of: applying programming voltages to a first control gate and to a second control gate to cause carriers to be injected and trapped in either a first charge trapping region or in a second charge trapping region; applying erasing voltages to the first control gate and to the second control gate to cause the trapped carriers to be removed from the first charge trapping region and/or the second charge trapping region; and applying a sequence of reading voltages to the first control gate and to the second control gate for determining a state of each of the first and the second charge trapping regions.

20 Claims, 6 Drawing Sheets

| Action | BD1 | BS | SG1 | WL1 | SG2 | WL2 | BD2 |
|---|---|---|---|---|---|---|---|
| Program Bit 1 | >> 0V (e.g. 5V) | 0V | >> Vtl (e.g. 5V) | Higher than current threshold for bit 2 | ≤ 0 | ≤ 0 | Floating |
| Program bit 2 | 0V | >> 0V (e.g. 5V) | Higher than current threshold for bit 1 | >> Vtl (e.g. 5V) | ≤ 0 | ≤ 0 | Floating |
| Block Erase | 0V | 0V | -15 to -25V | -15 to -25V | -15 to -25 | -15 to -25 | 0 |
| B-B hot carrier erase – bit 1 | >> 0V (e.g. 5V) | 0V | << 0V (e.g. -5V) | <0V | ≤ 0 | ≤ 0 | Floating |
| B-B hot carrier erase – bit 2 | 0V | >> 0V (e.g. 5V) | <0V | << 0V (e.g. -5V) | ≤ 0 | ≤ 0 | Floating |
| Read 00 | 0 | 1.6 | 2.5 | 2.5 | ≤ 0 | ≤ 0 | Floating |
| Read 01 | 0 | 1.6 | 2.5 | 6.5 | ≤ 0 | ≤ 0 | Floating |
| Read 10 | 0 | 1.6 | 6.5 | 2.5 | ≤ 0 | ≤ 0 | Floating |
| Read 11 | 0 | 1.6 | 6.5 | 6.5 | ≤ 0 | ≤ 0 | Floating |

FIG. 5

DUAL GATE MULTI-BIT SEMICONDUCTOR MEMORY

BACKGROUND OF THE INVENTION

1. Field of the Invention

The present invention relates to a read only memory. More particularly, the present invention relates to a semiconductor memory and an NROM memory cell therein having two independently controllable gates.

2. Description of Related Art

A conventional nitride read only (NROM) memory cell comprises a P-type substrate on which is formed an oxide/nitride/oxide (ONO) stacked layer structure, with the silicon nitride layer serving as an electron trapping layer. A control gate structure of a conducting polycrystalline layer is formed on the silicon oxide/silicon nitride/silicon oxide layer. An N+ source region and an N+ drain region are located in the substrate on either side to the gate structure.

The conventional NROM cell can store two bits of information, one bit of information being trapped as the presence or absence of negative charges in the trapping layer at the side of the source region and one bit of information being trapped as the presence or absence of negative charges in the trapping layer at the side of the drain region. The bit information at the source and the drain regions is separately read by detecting the presence of absence of current flowing between the source and the drain when appropriate voltages are applied to the gate, the source and the drain. However, in reading one of the two bits of data in the conventional NROM cell, the magnitude of the current that travels between the source and the drain regions may be affected by the presence or absence of the other bit of data. This is called the second-bit effect. The presence of the second-bit effect makes less reliable, the reading of the contents of the cell.

In addition to the second bit effect, when NROM cells are configured in an array, leakage currents from unselected cells may effect the reading of the contents of a selected cell. Such an effect is commonly called an array effect. Accordingly, it would be desirable for an NROM cell to have the capability of storing two bits of data where the presence or absence of one bit of the data does not influence the reading of the other bit of data, and where leakage currents generated from unselected cells in an array, which could effect the reliability of reading the contents of the selected cell, are not generated.

BRIEF SUMMARY OF THE INVENTION

Briefly stated, a method for altering and reading the contents of a memory cell is disclosed. Said memory cell includes in a substrate, a drain, a source and a channel therebetween, first and second charge trapping regions overlying the channel and first and second control gates proximate to respectively, the first and the second charge trapping regions, said cell being configured for independently storing a first bit, said first bit being represented by a presence or an absence of charges trapped in the first charge trapping region and a second bit, said second bit being represented by a presence or an absence of charges trapped in the second charge trapping region. The method comprises the steps of: applying programming voltages to the first control gate and to the second control gate to cause carriers to be injected and trapped in either the first charge trapping region or in the second charge trapping region, the trapped carriers representing a programmed state of a respective first bit or second bit; applying erasing voltages to the first control gate and to the second control gate to cause the trapped carriers to be removed from the first charge trapping region and/or the second charge trapping region, an absence of the trapped carriers from the first charge tapping region and/or the second trapping region representing an erased state of a respective first bit or second bit; and applying a sequence of reading voltages to the first control gate and to the second control gate for determining the state of the first bit and the state of the second bit.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 5 is a table of voltages for programming, erasing and reading the contents of the memory cell.

DETAILED DESCRIPTION OF THE INVENTION

Figure 1:
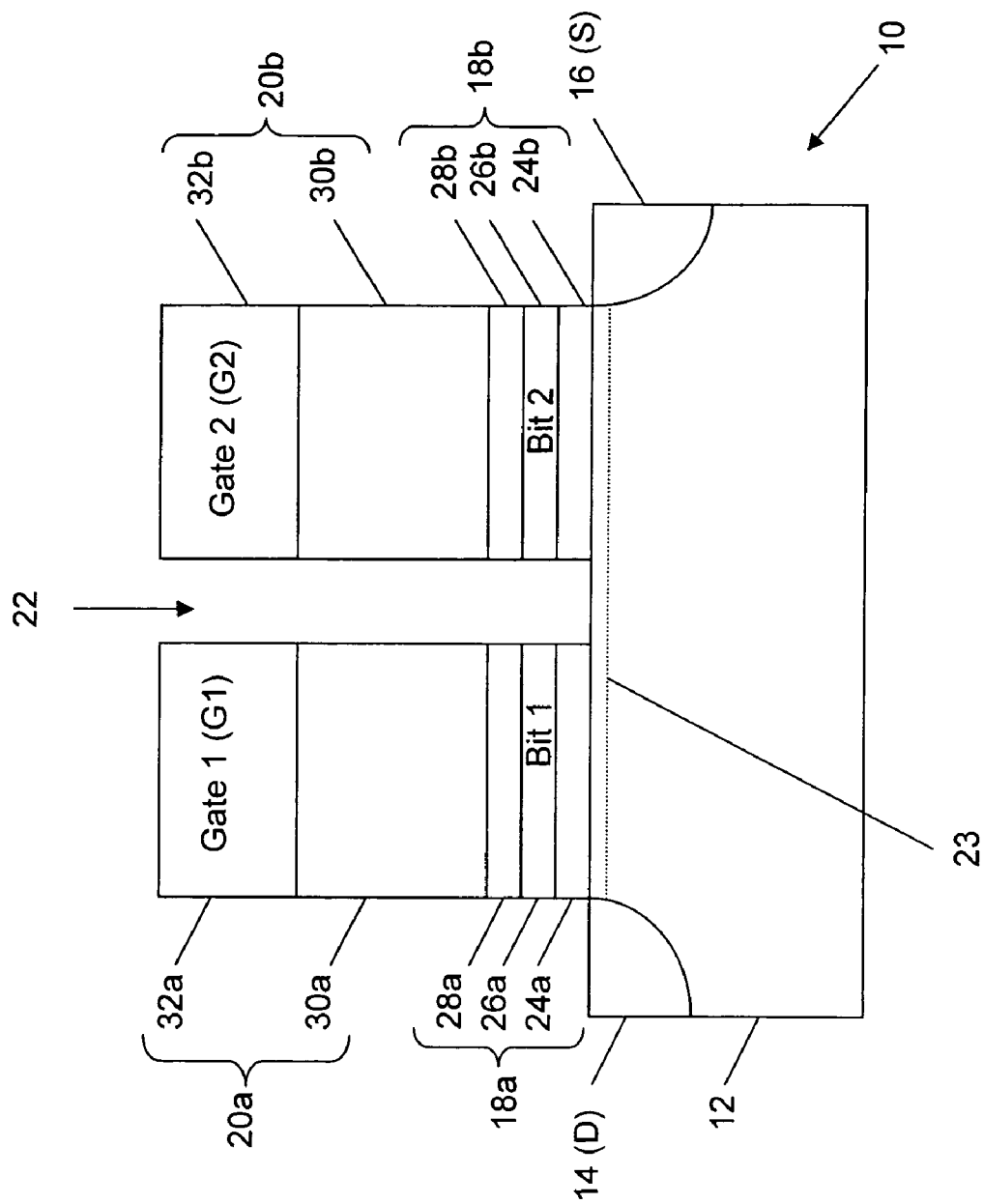
FIG. 1 is a cross sectional view of a memory cell in accordance with a preferred embodiment.

Referring to the drawings, wherein like numerals are used to indicate like elements throughout the several figures and the use of the indefinite article "a" may indicate a quantity of one, or more than one of an element, and where the use of the expression "or" refers to a Boolean exclusive OR operation, there is shown in FIG. 1 a cross sectional view of a preferred embodiment of a nitride read only (NROM) non-volatile memory cell 10 (hereafter cell 10) in accordance with a preferred embodiment of the present invention. The cell 10 comprises a substrate 12 having a drain region 14 (hereafter drain 14) and a source region 16 (hereafter source 16). It would be understood that the drain 14 and the source 16 are named as such only for the purpose of naming the parts of the cell 10 and that the drain 14 may assume the function of a source of electrons and the source 16 may assume the function of a drain of electrons depending upon the voltages applied to the cell 10.

In the preferred embodiment of the cell 10, a channel 23, having an approximate length of 0.12 μm., is located in the substrate 12 between the drain 14 and the source 16. Preferably, the substrate 12 is a P-type material and the drain 14 and the source 16 are each N+ regions. However, the substrate may be an N-type material and the drain 14 and the source 16 may be P+ regions and still be within the spirit and scope of the invention.

In the preferred embodiment of the cell 10, an oxide, nitride, oxide (ONO) charge trapping region consisting of a first portion 18a proximate to the drain 14 and a second portion 18b proximate to the source 16, overlays the channel 23 between the drain 14 and the source 16. The first and the second portions 18a, 18b of the charge trapping region are separated from each other by a space 22 filled with a dielectric. Preferably the space 22 has a length of approximately 30 nm. Each portion of the charge trapping region 18a, 18b comprises, a first silicon oxide dielectric layer of portions 24a, 24b, a silicon nitride dielectric layer of portions 26a, 26b and a second silicon oxide dielectric layer of portions 28a, 28b. The cell 10 also includes a first gate 20a (G1) formed proximate to the drain 14 and a second gate 20b (G2) is formed proximate to the source 16. Preferably, the first gate 20a and the second gate 20b each overlay a respective portion of the charge trapping layer 18a, 18b. Preferably, the first and the second gates 20a, 20b, comprise: (i) polycrystalline silicon portions 30a, 30b, and (ii) metal silicide portions 32a, 32b.

The cell 10 is configured for storing a first bit (bit 1) of information and a second bit (bit 2) of information, where a state the first bit is represented by a presence or an absence of charges trapped in the silicon nitride layer 24a of the first charge trapping layer 18a and the second bit is represented by a presence or an absence of charges trapped in the silicon nitride layer 24b of the second charge trapping layer 18b. Each of the bits may independently assume a programmed state, i.e. "0" state, or an erased state, i.e. "1" state. In the erased state, the nitride layer 26 in the vicinity of the respective source region 16 or drain region 14 is substantially devoid of electrical charges. In the erased state a first threshold voltage(Vt1) is required to be exceeded for inducing a current flow in the channel 23. In the programmed state, substantial negative charges are trapped in the silicon nitride layer 26a, 26b in the vicinity of the respective drain 14 or source 16 such that a voltage exceeding a second threshold (Vth), substantially greater than the first threshold, is required for inducing a current flow in the channel 23. Consequently, appropriately applied voltages to the first gate 20a, to the second gate 20b, and to the respective drain 14 and source 16 provide for independently programming and for erasing the first bit and the second bit of the cell 10, and for reading the contents of the cell 10 to determine whether the first and the second bits in the cell 10 are in a programmed state or in an erased state.

Figure 2:
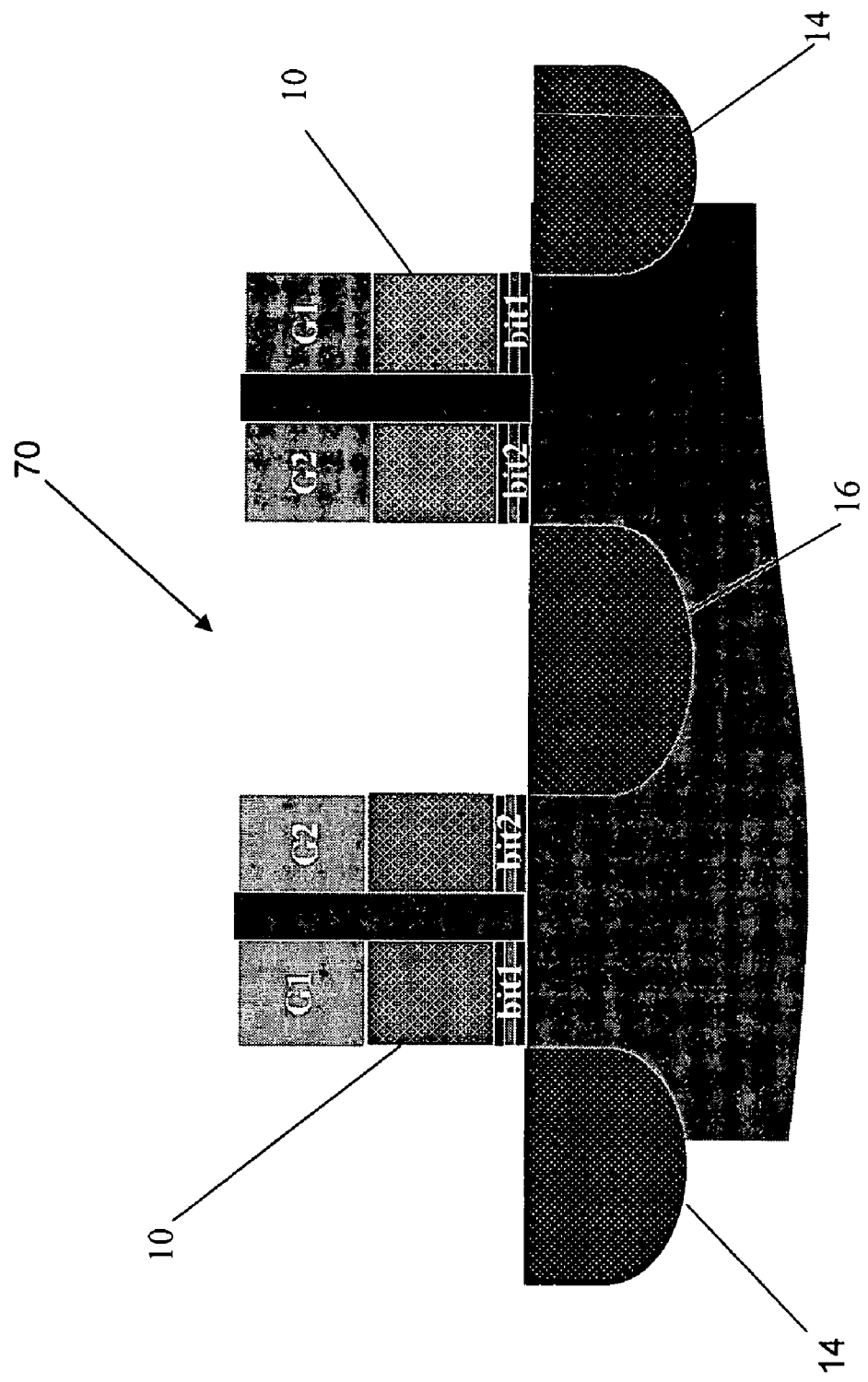
FIG. 2 is a cross sectional view of a memory element incorporating the memory cell of FIG. 1.

Referring now to FIG. 2, there is shown a cross-section of a memory element 70 comprising side by side memory cells 10.

Figure 3:
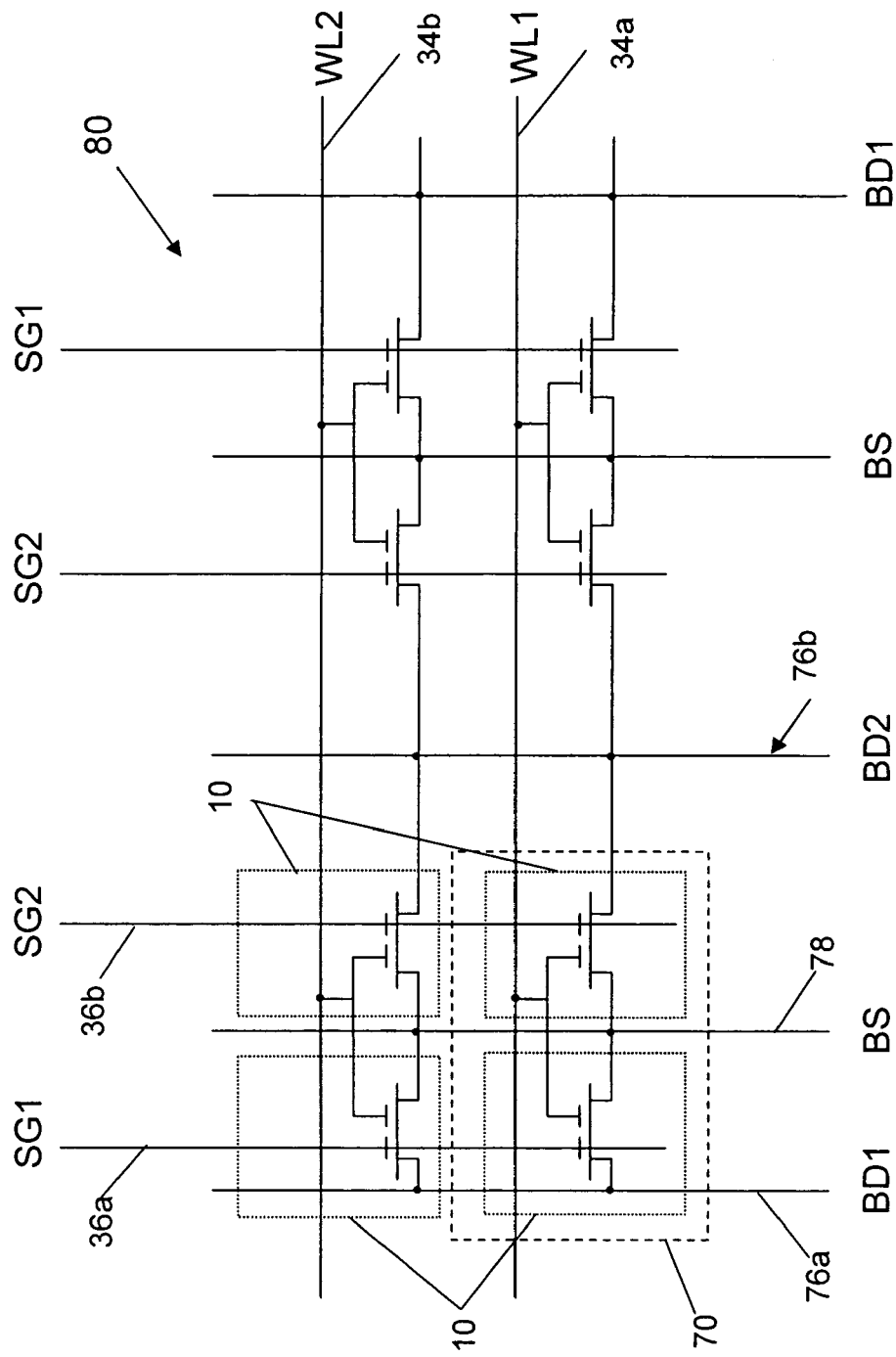
FIG. 3 is an electrical schematic of an array of a plurality of the memory element shown in FIG. 2.

FIG. 3 shows an electrical schematic of an array 80 of at least one row and at least one column of the memory elements 70 in which the cells 10 in each row are connected source to source 16 and drain to drain 14. Each first gate 20a in each column is connected to one of a plurality of gate control lines, examples of which are SG1 36a and SG2 36b and each second gate in each row is connected to a word line 34 examples of which are WL1 34a and WL2 34b. Also shown in FIG. 3 are drain bit lines BD1 76a and drain lines BD2 76b connecting together the drain 14 of each cell 10 in each column, and source bit lines (BS) 78 connecting together the source 16 of each cell 10 in each column. As would be clear to one skilled in the art, the array 80 is not limited in size to the four memory elements 70 shown in FIG. 3 but may be extended using known methods in the row direction and in the column direction by repeating the memory element 70 to form the memory array 80 having a size limited only by practical considerations.

Figure 4B:
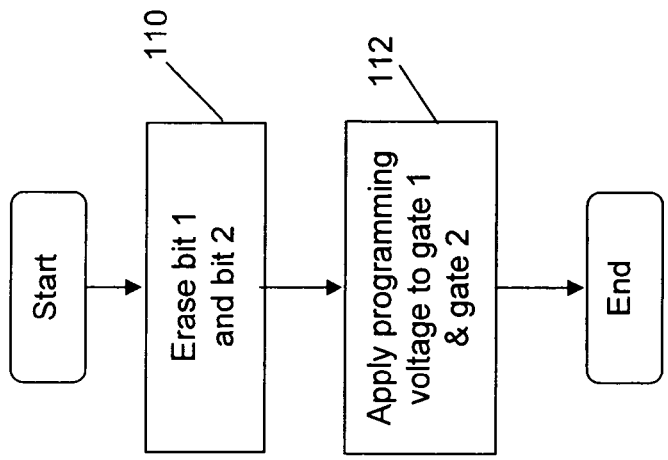
FIGS. 4A and 4B are flow diagrams of alternate processes for programming the memory cell.
Figure 4A:
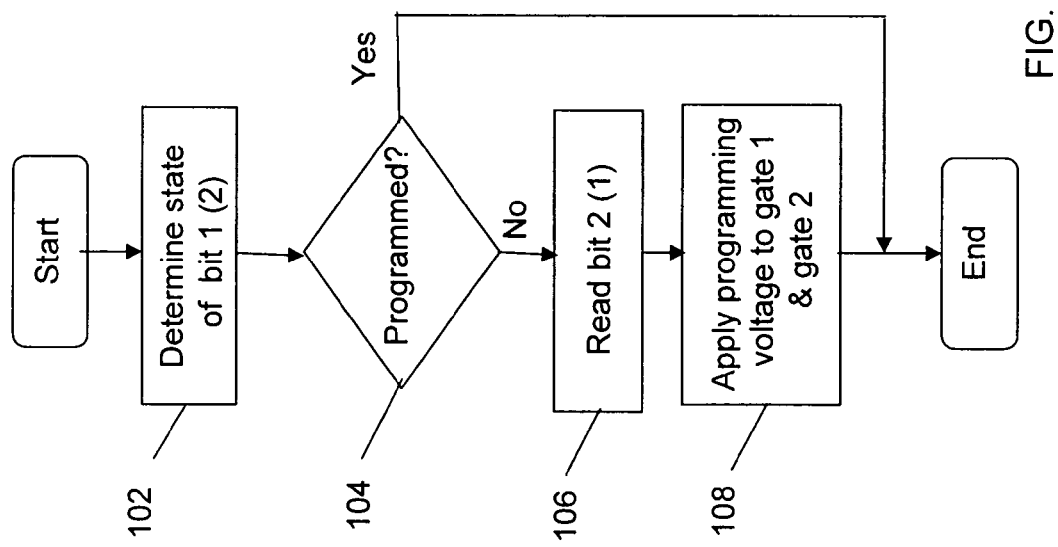

Referring nor to FIG. 4 there is shown a method for programming the memory cell 10 in which programming voltages are applied to the first control gate 20a and to the second control gate 20b to cause carriers to be injected into either the first charge trapping region 18a or the second charge trapping region 18b, where the presence of the trapped charges in the charge trapping region 18a, 18b represents a programmed state of the first bit or of the second bit. Preferably, as shown in FIG. 4., programming of the first bit (second bit) entails the steps of: (1) determining the state of the first bit (second bit) to determine whether the first bit (second bit) is in the programmed state or in the erased state (steps 102, 104); (2) determining the state of second bit (first bit) if the first bit (second bit) is in a programmed state (step 106) and (3) applying programming voltages of a predetermined magnitude to the first gate 20a and the second gate 20b (step 108), where the voltage applied to the second gate 20b (first gate 20a) depends on the state of the second bit (first bit). If the first bit (second bit) is already programmed (step 104), no further action is taken for programming the first bit.

Preferably, the magnitude of the programming voltages are related to the first threshold Vt1 and the second threshold Vth. Where the first bit (second bit) of the cell 10 is to be programmed, the programming voltage having magnitude greater than the first threshold is applied to the first gate 20a (second gate 20b). If the second bit is in the erased state, the programming voltage having a magnitude greater than the first threshold Vt1 is applied to the second gate 20b (first gate 20a). If the second bit is in the programmed state, the programming voltage having a magnitude greater than the second threshold Vth is applied to the second gate 20b (first gate 20a). Also, when programming the first bit (second bit) of the cell 10, a voltage is applied to the drain 14 (source 16) having positive value with respect to the voltage applied to the source 16 (drain 14) and a negative value with respect to the first gate 20a (second gate 20b).

Alternatively, where it is unnecessary to preserve the state of the second bit (first bit) when programming the first bit (second bit) such as when data will be written to both the first bit and the second bit, the first bit and the second bit may be erased prior to programming the first bit (second bit). Consequently, as shown in FIG. 4b, the steps for programming the first bit include erasing the first bit and the second bit 110 and thereafter applying programming voltages to the first gate 20a and the second gate 20b 112.

The preferred ranges of voltages for hot channel electron programming of the first bit and the second bit are shown in FIG. 5. As shown in FIG. 3 the cell 10 is generally configured as part of an array 80. Consequently, when programming, erasing and reading the cell 10, appropriate voltages must be applied to other cells 10 in the array 80 to avoid generation of spurious leakage currents which could result in erroneous programming, reading or erasing of the desired cell 10. Consequently FIG. 5 also identifies the preferred voltages to be applied to the other cells 10 of the array 80 when programming, erasing and reading the cell 10.

In the preferred embodiment of the cell 10, charged carriers are removed from the first charge trapping region 18a and/or the second trapping region 18b by applying erase voltages to the first gate 20a and to the second gate 20b. An absence of the trapped carriers from the first charge tapping region 18a and/or the second trapping region 18b represents an erased state of the respective first bit or second bit. In a block erase operation, where both the first bit and the second bit of the cell 10 are to be erased, the step of applying erasing voltages includes the step of applying a voltage to both the first gate 20a and to the second gate 20b which is sufficiently negative with respect to a voltage applied to the source and to the drain to cause Fowler-Nordheim tunneling. In the preferred embodiment, as shown in FIG. 5, the voltages applied to the first gate 20a and the second gate 20b are in the range of −15 to −25 volts. Additionally, since a block erase operation is being performed, the same voltages are applied to the other cells 10 in the block being erased.

Alternative to performing a block erase, the step of applying an erasing voltage to the cell 10 for erasing only the first bit may be performed using hot carrier tunneling by the step of applying a voltage to the second gate 20b which is positive with respect to a voltage applied to the first gate 20a and is negative with respect to a voltage applied to the drain 14. In the preferred embodiment, as shown in FIG. 5, the voltage applied to the first gate 20a is approximately −5 volts, the voltage applied to the second gate 20b is approximately 0 volts and the voltage applied to the drain is +5 v. Also, if only the second bit is to be erased, the step of applying an erasing voltage includes the step of applying a voltage to the first gate 20a which is positive with respect to a voltage applied to the second gate 20b and is negative with respect to a voltage applied to the source 16. In the preferred embodiment, as shown in FIG. 5, the voltage applied to the first gate 20a is approximately 0 volts, the voltage applied to the second gate 20b is approximately −5 volts and the voltage applied to the source is +5 volts.

Figure 6:
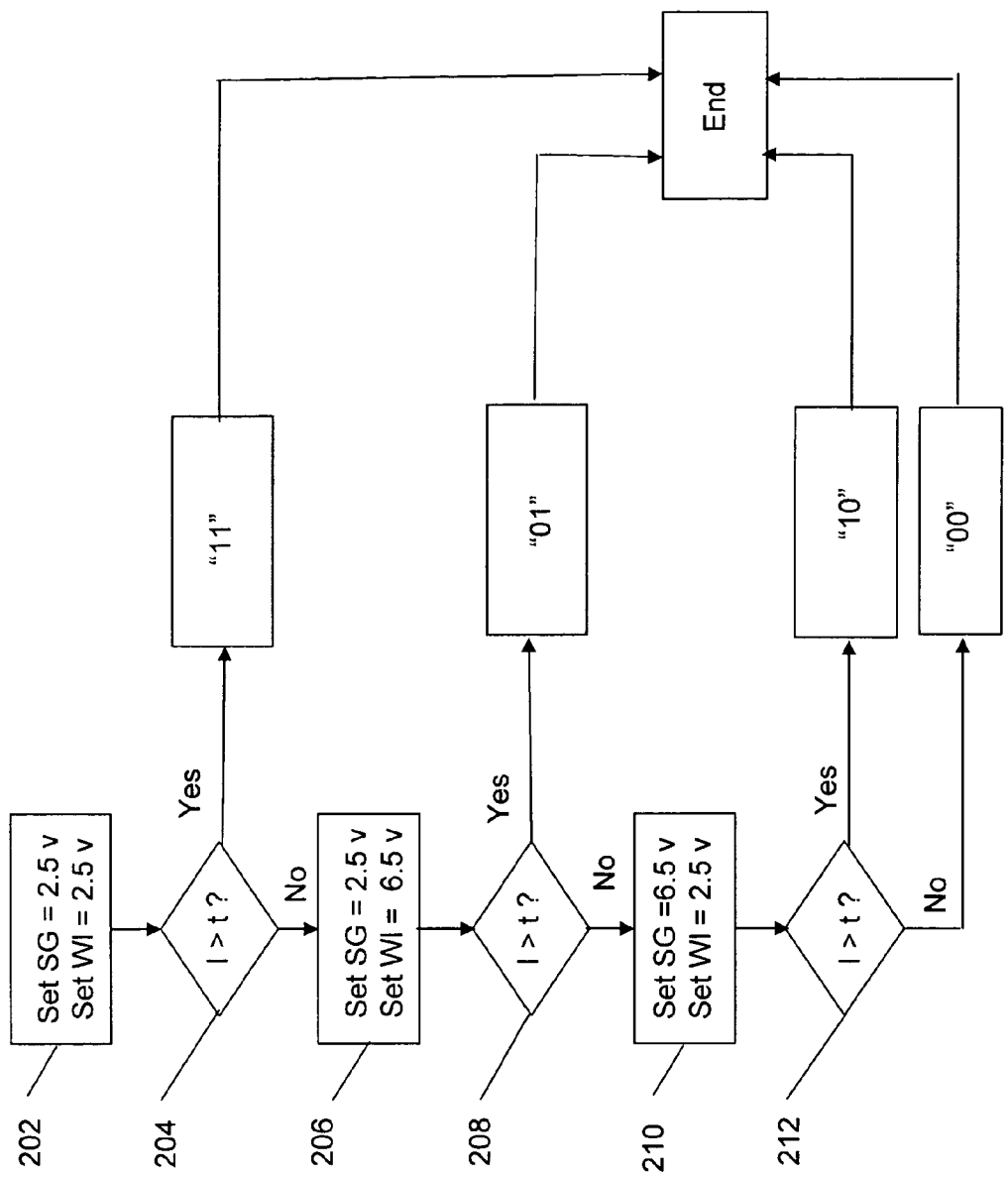
FIG. 6 is a flow diagram of a process for reading the contents of the memory cell.

As shown in FIG. 6, the step of applying a sequence of reading voltages to the first gate and to the second gate includes the steps of: (i) applying a first voltage greater than the first threshold but less than the second threshold to the first gate 20a and to the second gate 20b (step 202); (ii) applying the first voltage greater than the first threshold but less than the second threshold to the first gate 20a and a second voltage greater than the second threshold to the second gate 20b (step 206) if a current flow between the source 16 and the drain 14 is not detected at step (i) (step 204); and (iii) applying the first voltage greater than the first threshold but less than the second threshold to the second gate 20b and the second voltage greater than the second threshold to the first gate 20a (step 210) if a current flow between the source 16 and the drain 14 is not detected at step (208) (ii). Finally, all of the states of the first bit and the second bit are determined by determining if a current flow between the source 16 and the drain 14 is not detected when applying the first voltage greater than the first threshold but less than the second threshold to the second gate 20b and the second voltage greater than the second threshold to the first gate 20a. (step 212). Accordingly the first bit is determined to be in the erased state if a current greater than a predetermined value is detected at step (i) or step (iii), and the second bit is determined to be in the erased state if a current greater than a predetermined value is detected at step (i) or step (ii).

As shown in FIG. 5, the preferred value for the first voltage is 2.5 volts and the preferred value for the second voltage is 6.5 volts. Preferably, a voltage of 1.6 volts is applied to the source and 0 volts is applied to the drain. However, the voltages applied to the source and the drain may be reversed and the read operation will be identical except for the direction of the current between the source 16 and the drain 14.

A second preferred embodiment of the invention includes a method for altering and reading the contents of the array of memory elements 80. The method includes the steps of: applying programming voltages to one of the word lines 34a, 34b and one of the control gate lines 36a, 36b to select one of the cells 10 and to cause carriers to be injected and trapped in either the first charge trapping region or in the second charge trapping region of the selected cell 10; applying erasing voltages to the one of the word lines 34a, 34b and the one of the control gate lines 36a, 36b to select the one of the cells 10 and to cause the trapped carriers in the selected cell 10 to be removed from the first charge trapping region and/or the second charge trapping region; and applying a sequence of reading voltages to the one of the word lines and to the one of the gate control lines to select the one of the cells and for determining the state of the first bit and the state of the second bit.

In the second preferred embodiment, the voltage applied to the gate control lines 36a, 36b and the word lines 34a, 34b connected to the unselected cells 10 are negative with respect to the voltages of the control gate lines 36a, 36b and the word lines 34a, 34b applied to the selected cell 10. More preferably the voltages applied to the gate control lines 36a, 36b and the word lines 34a, 34b connected to the unselected cells 10 are less than or equal to zero volts. Preferably, the drain bit lines 76b connected to the drains 14 of the unselected cells 10 are floating. Consequently, the magnitude of leakage currents that could cause errors in reading the contents of the selected cell 10 are suppressed.

One skilled in the art would understand that the programming, erasing and reading of the memory cell 10 is not limited to the specific voltages shown in FIG. 5 as these voltages would vary according to the size of the cell 10 and the specific materials used to fabricate the memory cell 10.

As can be understood from a reading of the application, a novel method of operating a memory cell is disclosed which provides for independently programming, erasing and reading first and second bits stored in the memory cell 10 such that the second bit effect and the array effect are mitigated.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for altering and reading the contents of a memory cell, said memory cell including in a substrate, a drain, a source and a channel therebetween, first and second charge trapping regions overlying the channel and first and second control gates proximate to respectively, the first and the second charge trapping regions, said cell being configured for independently storing a first bit, said first bit being represented by a presence or an absence of charges trapped in the first charge trapping region and a second bit, said second bit being represented by a presence or an absence of charges trapped in the second charge trapping region, the method comprising the steps of:

applying programming voltages to the first control gate and to the second control gate to cause carriers to be injected and trapped in either the first charge trapping region or in the second charge trapping region, the trapped carriers representing a programmed state of a respective first bit or second bit;

applying erasing voltages to the first control gate and to the second control gate to cause the trapped carriers to be removed from the first charge trapping region and/or the second charge trapping region, an absence of the trapped carriers from the first charge tapping region and/or the second trapping region representing an erased state of a respective first bit or second bit; and applying a sequence of reading voltages to the first control gate and to the second control gate for determining the state of the first bit and the state of the second bit.

2. The method of claim 1, wherein if the first bit is to be programmed, the step of applying the programming voltages includes the steps of:
  determining the state of the first bit;
  determining the state of the second bit if the first bit is in the erased state; and
  applying the programming voltages to the first gate and to the second gate.

3. The method of claim 1, wherein if both the first and the second bit are to be programmed, the step of applying the programming voltages includes the steps of:
  applying the erasing voltages to the first gate and to the second gate; and
  applying the programming voltages to the first gate and the second gate.

4. The method of claim 1, wherein the cell is characterized by a first threshold corresponding to the erased state of the first bit and/or the second bit and a second threshold corresponding to the programmed state of the first bit and/or the second bit, and wherein if the first bit is to be programmed, the step of applying programming voltages to the first and the second gates includes the steps of applying a magnitude of the programming voltage to the first gate greater than the first threshold and applying a magnitude of the programming voltage to the second gate greater than the first threshold if the second bit is in the erased state, and greater than the second threshold if the second bit is in the programmed state.

5. The method of claim 4, further including the step of applying a voltage to the drain that is positive with respect to the source and is negative with respect to the voltage applied to the first gate.

6. The method of claim 1, wherein if both the first bit and the second bit are to be erased, the step of applying an erasing voltage includes the step of applying a voltage to both the first gate and to the second gate which is sufficiently negative with respect to a voltage applied to the source and to the drain to cause Fowler-Nordheim tunneling.

7. The method of claim 1, wherein if only the first bit is to be erased, the step of applying an erasing voltage includes the step of applying a voltage to the second gate which is positive with respect to a voltage applied to the first gate and is negative with respect to a voltage applied to the drain.

8. The method of claim 1, wherein the first gate and the second gate are each characterized by a first threshold corresponding to the erased state and a second threshold corresponding to the programmed state, and wherein the step of applying a sequence of reading voltages includes the steps of:
  (i) applying a first voltage greater than the first threshold but less than the second threshold to the first gate and to the second gate;
  (ii) applying the first voltage to the first gate and a second voltage greater than the second threshold to the second gate if a current flow between the source and the drain is not detected at step (i); and
  (iii) applying the first voltage to the second gate and the second voltage to the first gate if a current flow between the source and the drain is not detected at step (ii).

9. The method of claim 8, further including the step of determining the first bit to be in the erased state if a current greater than a predetermined value is detected at step (i) or step (iii).

10. The method of claim 8, further including the step of determining the second bit to be in the erased state if a current greater than a predetermined value is detected at step (i) or step (ii).

11. A method for altering and reading the contents of a memory, said memory including a plurality of rows and columns of memory cells, each cell including in a substrate, a drain connected to a drain bit line, a source connected to a source bit line and a channel therebetween, first and second charge trapping regions overlying the channel and first and second control gates proximate to respectively, the first and the second charge trapping regions, said cell being configured for independently storing a first bit, said first bit being represented by a presence or an absence of charges trapped in the first charge trapping region and a second bit, said second bit being represented by a presence or an absence of charges trapped in the second charge trapping region, the method comprising the steps of:
  applying programming voltages to one of the word lines and one of the control gate lines to select one of the cells and to cause carriers to be injected and trapped in either the first charge trapping region or in the second charge trapping region of the selected cell, the trapped carriers representing a programmed state of a respective first bit or second bit;
  applying erasing voltages to the one of the word lines and to the one of the control gate lines to select the one of the cells and to cause the trapped carriers in the selected cell to be removed from the first charge trapping region and/or the second charge trapping region, an absence of the trapped carriers from the first charge tapping region and/or the second trapping region representing an erased state of a respective first bit or second bit; and
  applying a sequence of reading voltages the one of the word lines and the one of the gate control lines to select the one of the cells and for determining the state of the first bit and the state of the second bit.

12. The method of claim 11, wherein if the first bit is to be programmed, the step of applying the programming voltages includes the steps of:
  determining the state of the first bit;
  determining the state of the second bit if the first bit is in the erased state; and
  applying the programming voltages to the one of the word lines and to the one of the control gate lines.

13. The method of claim 11, wherein if both the first and the second bit are to be programmed, the step of applying the programming voltages includes the steps of:
  applying the erasing voltages to the first gate and to the second gate; and
  applying the programming voltages to the one of the word lines and to the one of the control gate lines.

14. The method of claim 11, wherein the cell is characterized by a first threshold corresponding to the erased state of the first bit and/or the second bit and a second threshold corresponding to the programmed state of the first bit and/or the second bit, and wherein if the first bit is to be programmed, the step of applying programming voltages to the one of the word lines and to the one of the control gate lines includes the steps of applying a magnitude of the programming voltage to the one of the control gate lines greater than the first threshold and applying a magnitude of the programming voltage to the one of the word lines greater than the first threshold if the second bit is in the erased state, and greater than the second threshold if the second bit is in the programmed state.

15. The method of claim 14, further including the step of applying a voltage to the drain bit line connected to the selected cell that is positive with respect to the source bit line that is connected to the selected cell and is negative with respect to the voltage applied to the one of the control gate lines.

16. The method of claim 11, wherein if both the first bit and the second bit are to be erased, the step of applying an erasing voltage includes the step of applying a voltage to both the one of the word lines and to the one of the control gate lines which is sufficiently negative with respect to a voltage applied to the source bit line connected to the selected cell and to the drain bit line connected to the selected cell to cause Fowler-Nordheim tunneling.

17. The method of claim 11, wherein if only the first bit is to be erased, the step of applying an erasing voltage includes the step of applying a voltage to the one of the word lines which is positive with respect to a voltage applied to the one of the control gate lines and is negative with respect to a voltage applied to the drain bit line connected to the selected cell.

18. The method of claim 11, wherein the first gate and the second gate are each characterized by a first threshold corresponding to the erased state and a second threshold corresponding to the programmed state, and wherein the step of applying a sequence of reading voltages includes the steps of:

(i) applying a first voltage greater than the first threshold but less than the second threshold to the one of the word lines and to the one of the control gate lines;

(ii) applying the first voltage to the one of the gate control lines and a second voltage greater than the second threshold to the one of the word lines if a current flow between the source and the drain of the selected cell is not detected at step (i); and (iii) applying the first voltage to the one of the word lines and the second voltage to the one of the gate control lines if a current flow between the source and the drain of the selected cell is not detected at step (ii).

19. The method of claim 18, further including the step of determining the first bit to be in the erased state if a current greater than a predetermined value is detected at step (i) or step (iii).

20. The method of claim 18, further including the step of determining the second bit to be in the erased state if a current greater than a predetermined value is detected at step (i) or step (ii).

* * * * *